United States Patent
Cheun et al.

(10) Patent No.: US 8,166,373 B2
(45) Date of Patent: Apr. 24, 2012

(54) METHOD AND APPARATUS FOR TURBO ENCODING AND DECODING

(75) Inventors: Kyung Whon Cheun, Pohang-si (KR); Yong Sang Kim, Pohang-si (KR); Wang rok Oh, Pohang-si (KR)

(73) Assignee: LG Electronics Inc., Seoul (KR)

( * ) Notice: Subject to any disclaimer, the term of this patent is extended or adjusted under 35 U.S.C. 154(b) by 720 days.

(21) Appl. No.: 12/065,718

(22) PCT Filed: Sep. 5, 2006

(86) PCT No.: PCT/KR2006/003525
§ 371 (c)(1),
(2), (4) Date: Feb. 2, 2009

(87) PCT Pub. No.: WO2007/055467
PCT Pub. Date: May 18, 2007

(65) Prior Publication Data
US 2009/0158130 A1    Jun. 18, 2009

(30) Foreign Application Priority Data

Sep. 5, 2005 (KR) .......................... 10-2005-0082445

(51) Int. Cl.
*H03M 13/00* (2006.01)
(52) U.S. Cl. ....................................... 714/776
(58) Field of Classification Search .................. 714/746, 714/747, 755–768, 776, 781–795
See application file for complete search history.

(56) References Cited

U.S. PATENT DOCUMENTS

| | | | |
|---|---|---|---|
| 5,778,011 A * | 7/1998 | Blaum et al. | 714/755 |
| 6,691,275 B1 * | 2/2004 | Jaeckel | 714/752 |
| 7,958,425 B2 * | 6/2011 | Chugg et al. | 714/755 |
| 2003/0106011 A1 * | 6/2003 | Miyauchi et al. | 714/780 |
| 2003/0135809 A1 | 7/2003 | Kim | |
| 2008/0320362 A1 * | 12/2008 | Taubin et al. | 714/755 |

FOREIGN PATENT DOCUMENTS

| | | |
|---|---|---|
| EP | 1248377 | 10/2002 |
| WO | 99/50963 | 10/1999 |
| WO | 99/55011 | 10/1999 |

OTHER PUBLICATIONS

Kim, S., et al., "A Memory-Efficient Block-wise MAP Decoder Architecture," ETRI Journal, vol. 26, No. 6, Dec. 2004.

(Continued)

*Primary Examiner* — Nadeem Iqbal
(74) *Attorney, Agent, or Firm* — Lee, Hong, Degerman, Kang & Waimey

(57) ABSTRACT

A method and apparatus for turbo encoding and method and apparatus for turbo decoding are disclosed, by which encoding and decoding speeds of turbo codes and performance thereof can be enhanced. In performing turbo encoding on inputted information bits by a unit of an information frame including a predetermined number of bits, the present invention includes dividing the information frame into at least two information sub-blocks, encoding each of the at least two information sub-blocks independently, rearranging information bits configuring the information frame by interleaving the information frame, dividing the rearranged information frame into at least two information sub-blocks, and encoding each of the at least two information sub-blocks independently.

13 Claims, 8 Drawing Sheets

OTHER PUBLICATIONS

Weiss et al., "Code Construction and Decoding of Parallel Concatenated Tail-Biting Codes," IEEE Transactions on Information Theory, vol. 47, No. 1, Jan. 2001, pp. 366-386, XP-011027856.

Hagenauer et al., "Iterative Decoding of Binary Block and Convolutional Codes", IEEE Transactions on Information Theory, vol. 42, No.2, Mar. 1996, pp. 429-445, XP-011026493.

Weiss et al., "Turbo decoding with tail-biting trellises", URSI International Symposium on PISA, Sep. 1998, pp. 343-348, XP-010316822.

Dobkin et al., "Parallel VLSI architecture for map turbo decoder," The 13th IEEE International Symposium on Personal, Indoor and Mobile Radio Communications, vol. 1, Sep. 2002, pp. 384-388, XP-010614252.

\* cited by examiner

METHOD AND APPARATUS FOR TURBO ENCODING AND DECODING

CROSS-REFERENCE TO RELATED APPLICATIONS

This application is the National Stage filing under 35 U.S.C. §371 of International Application No. PCT/KR06/03525, filed on Sep. 5, 2006, which claims the benefit and right of priority to Korean Application No. 10-2005-0082445, filed on Sep. 5, 2005.

TECHNICAL FIELD

The present invention relates to turbo encoding and decoding, and more particularly, to a method and apparatus for turbo encoding and method and apparatus for turbo decoding. Although the present invention is suitable for a wide scope of applications, it is particularly suitable for enhancing speed and performance of encoding or decoding in case of using turbo codes as channel codes.

BACKGROUND ART

Generally, Shannon capacity is a limit value of a transmission data rate to secure reliable communications for a channel having various noises. Many efforts have been made to meet channel code performance approaching a limit of channel capacity and such a channel code condition as encoding and decoding complexity, decoding speed and the like.

A next generation mobile communication system needs a fast data rate and reliable data transfer. For this, a powerful channel-encoding scheme is necessary. A turbo encoder is configured in a manner that two recursive type convolutional encoders are connected parallel to each other to leave an interleaver in-between. Since channel capacity of the turbo codes has excellent performance close to that of Shannon capacity, the turbo codes can become channel codes suitable for the next generation mobile communication system.

FIG. 1 is a block diagram of a general turbo encoder according to a related art. Referring to FIG. 1, a first constituent encoder 1 receives information bits and then generates first redundant bits by encoding the received information bits. A second constituent encoder 3 receives information bits interleaved by an encoder interleaver 2 and then generates second redundant bits by encoding the encoded information bits. In case of turbo encoding, the first or second redundant bits are parity bits.

For highly reliable decoding by a turbo decoder, each constituent encoder of a turbo encoder adopts a scheme of forcing trellis to be terminated by inserting tail bits or a circular coding scheme. In the circular coding scheme, an initial state of trellis is set equal to a final state of the trellis. Since there is no additional bit insertion, the circular coding scheme provides band efficiency higher than that of the tail-bit inserting scheme. In this case, the initial and final states are named a circular state. In order to determine the circular state, an initial state is set to a zero state and the final state is then found by performing encoding. So, it is able to calculate the circular state using the final state and a specific encoder configuration. And, it is also able to generate redundant bits by re-executing encoding by setting the calculated circular state to the initial state.

FIG. 2 is a block diagram of a turbo decoder in accordance with a related art. Referring to FIG. 2, an information bit sequence, a first redundant bit sequence and a second redundant bit sequence outputted from the encoder shown in FIG. 1 are modulated and then transmitted to a receiver for a turbo encoder shown in FIG. 2.

The receiver receives the modulated bit sequences, demodulates the received bit sequences, and then supplies the demodulated bit sequences to the turbo decoder shown in FIG. 2. A first constituent decoder 4 receives the demodulated information bits and the demodulated first redundant bits, performs a decoding process on the received bits, and then calculates extrinsic information of the first constituent decoder 4.

A decoder interleaver 5' interleaves the extrinsic information of the first constituent decoder 4 and then inputs the interleaved extrinsic information to a second constituent decoder 6. The second constituent decoder 6 receives the demodulated information bits, the demodulated second redundant bits and then the first constituent decoder's extrinsic information interleaved by the decoder interleaver 5, performs a decoding process on the received bits and information, and then calculates extrinsic information of the second constituent decoder 6.

A decoder deinterleaver 7 rearranges the extrinsic information of the second constituent decoder 6 and then inputs the rearranged extrinsic information to the first constituent decoder 4. The above explanation is a description of a decoding process corresponding to an iterative decoding count of 1. And, the iterative decoding process keeps proceeding, unit specific decoding performance is achieved.

Thus, the turbo decoder consists of a plurality of constituent decoders. And, internal elements of each of the constituent decoders calculate various kinds of metrics to perform a decoding operation. These metrics are classified into a transition metric, a forward metric and a backward metric. And, a log likelihood ratio (hereinafter abbreviated LLR) of information bits and the like are calculated based on the forward and backward metrics.

FIG. 3A and FIG. 3B are diagrams for forward and backward metric operational methods in a turbo decoder according to a related art, respectively.

Referring to FIG. 3A, a $k^{th}$ forward metric $\alpha_k$ is calculated from a $(k-1)^{th}$ forward metric $\alpha_{k-1}$ and a $(k-1)^{th}$ transition metric $\gamma_{k-1}$. And, a $k^{th}$ backward metric $\beta_k$ is calculated from a $(k+1)^{th}$ backward metric $\beta_{k-1}$ and a $(k+1)^{th}$ transition metric $\gamma_{k+1}$.

Although a general turbo decoder needs to calculate both forward and backward metrics to decide transferred information bits, since a forward metric calculating process sequentially proceeds from a first information bit to an $N^{th}$ information bit and a backward metric calculating process sequentially proceeds from the $N^{th}$ information bit to the first information bit, there occurs a delay amounting to an entire information frame length. Besides, since the turbo decoder performs the iterative decoding, it is unable to avoid iterative operations of the forward and backward metrics. So, such a decoding delay is regarded as a disadvantage of the turbo code decoder.

To solve the above disadvantage, various decoding schemes, each of which consists of the steps of dividing a frame length (N) of information bits into $n_{sub}$ sub-blocks and performing parallel decoding on each of the sub-blocks, have been proposed.

As representative decoding schemes, there are a scheme of inserting tail bits per a sub-block and a scheme of performing an additional metric calculation by leaving guard windows in front and rear of trellis of a sub-block in calculating forward and backward metrics in a sub-block decoding process.

These parallel decoding schemes are advantageous in that a decoding delay is reduced about $1/n_{sub}$ time smaller than that of a conventional decoding scheme. Yet, they are disadvantageous in that tail bits should be inserted per sub-block or an additional metric calculation needs to be done to prevent metric reliability from being lowered in decoding each sub-block. This is because the tail bit insertion decreases a data rate or the additional metric calculation execution increases decoding complexity. Moreover, these parallel decoding schemes accelerate performance degradation as a length of sub-block gets smaller, i.e., the $n_{sub}$ gets larger.

FIG. 4A and FIG. 4B are diagrams for forward and backward metric operational methods in a turbo code decoding apparatus adopting a circular decoding scheme, respectively.

Referring to FIG. 4A and FIG. 4B, in case of a forward metric operation, if a forward metric $\alpha_N^{(i)}$ in a final state is calculated in an $i^{th}$ iterative decoding, it is used as a forward metric $\alpha_0^{(i+1)}$ in an initial state in an $(i+1)^{th}$ iterative decoding. In case of a backward metric operation, if a backward metric $\beta_N^{(i)}$ is calculated in an $i^{th}$ iterative decoding, it is used as a backward metric $\beta_N^{(i+1)}$ in a final state in an $(i+1)^{th}$ iterative decoding. Through theses methods, a sequential calculation process of forward and backward metrics can continue without interruption, whereby metric reliability can be gradually raised.

DISCLOSURE OF THE INVENTION

Accordingly, the present invention is directed to a method and apparatus for turbo encoding and method and apparatus for turbo decoding that substantially obviate one or more of the problems due to limitations and disadvantages of the related art.

An object of the present invention is to provide a method and apparatus for turbo encoding and method and apparatus for turbo decoding, by which encoding and decoding speeds of turbo codes and performance thereof can be enhanced.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of turbo encoding, which is performed on inputted information bits by a unit of an information frame including a predetermined number of bits, according to the present invention includes the steps of dividing the information frame into at least two information sub-blocks, encoding each of the at least two information sub-blocks independently, rearranging information bits configuring the information frame by interleaving the information frame, dividing the rearranged information frame into at least two information sub-blocks, and encoding each of the at least two information sub-blocks independently.

To further achieve these and other advantages and in accordance with the purpose of the present invention, a method of decoding turbo codes, by which a bit sequence is encoded, includes a first step of dividing a first information frame including information bits included in the encoded bit sequence and first redundant bits into at least two received sub-blocks and decoding each of the at least two received sub-blocks independently, a second step of rearranging the information bits by performing interleaving on the information bits, and a third step of dividing a second information frame including the rearranged information bits and second redundant bits into at least two received sub-blocks and encoding each of the at least two received sub-blocks independently.

Preferably, the method further includes a fourth step of dividing a third information frame including a first extrinsic information sequence outputted from the third step to have a rearranged order, the information bits included in the encoded bit sequence and the second redundant bits into at least two received sub-blocks and decoding each of the at least two sub-blocks independently, a fifth step of rearranging an order of the information bits by interleaving the information bits, and a sixth step of dividing a fourth information frame including a first extrinsic information sequence outputted from the first step to have a rearranged order, the rearranged information bits and the second redundant bits into at least two received sub-blocks and decoding each of the at least two sub-blocks independently.

To further achieve these and other advantages and in accordance with the purpose of the present invention, an apparatus for performing turbo encoding, which is performed on inputted information bits by a unit of an information frame including a predetermined number of bits, includes a first constituent encoding module dividing the information frame into at least two information sub-blocks, the first constituent encoding module encoding each of the at least two information sub-blocks independently, an interleaver rearranging information bits configuring the information frame by interleaving the information frame, and a second constituent encoding module dividing the rearranged information frame into at least two information sub-blocks, the second constituent encoding module encoding each of the at least two information sub-blocks independently.

Preferably, the first constituent encoding module includes a first information sub-block generator dividing the information frame into the at least two information sub-blocks, the first information sub-block generator outputting the at least two information sub-blocks and a first sub-block constituent encoding unit comprising at least two sub-block constituent encoders encoding the at least two information sub-blocks, respectively.

Preferably, the second constituent encoding module includes a second information sub-block generator dividing the rearranged information frame into the at least two information sub-blocks, the first information sub-block generator outputting the at least two information sub-blocks and a second sub-block constituent encoding unit comprising at least two sub-block constituent encoders encoding the at least two information sub-blocks outputted from the second information sub-block generator, respectively.

To further achieve these and other advantages and in accordance with the purpose of the present invention, an apparatus for decoding turbo codes, by which a bit sequence is encoded, includes a first constituent decoding module outputting a first extrinsic information sequence in a manner of dividing a first information frame including information bits included in the encoded bit sequence and first redundant bits into at least two received sub-blocks and decoding each of the at least two received sub-blocks independently, a first decoder interleaver rearranging the information bits by performing interleaving on the information bits, a second decoder interleaver interleaving to rearrange the first extrinsic information sequence outputted by the first constituent decoding module, a second constituent decoding module outputting a second extrinsic information sequence in a manner of dividing a second information frame including the rearranged information bits and second redundant bits into at least two received sub-blocks and decoding each of the at least two received sub-blocks independently, and a decoder deinterleaver rearranging to output the second extrinsic information sequence.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

BEST MODE FOR CARRYING OUT THE INVENTION

Reference will now be made in detail to the preferred embodiments of the present invention, examples of which are illustrated in the accompanying drawings.

Figure 5:
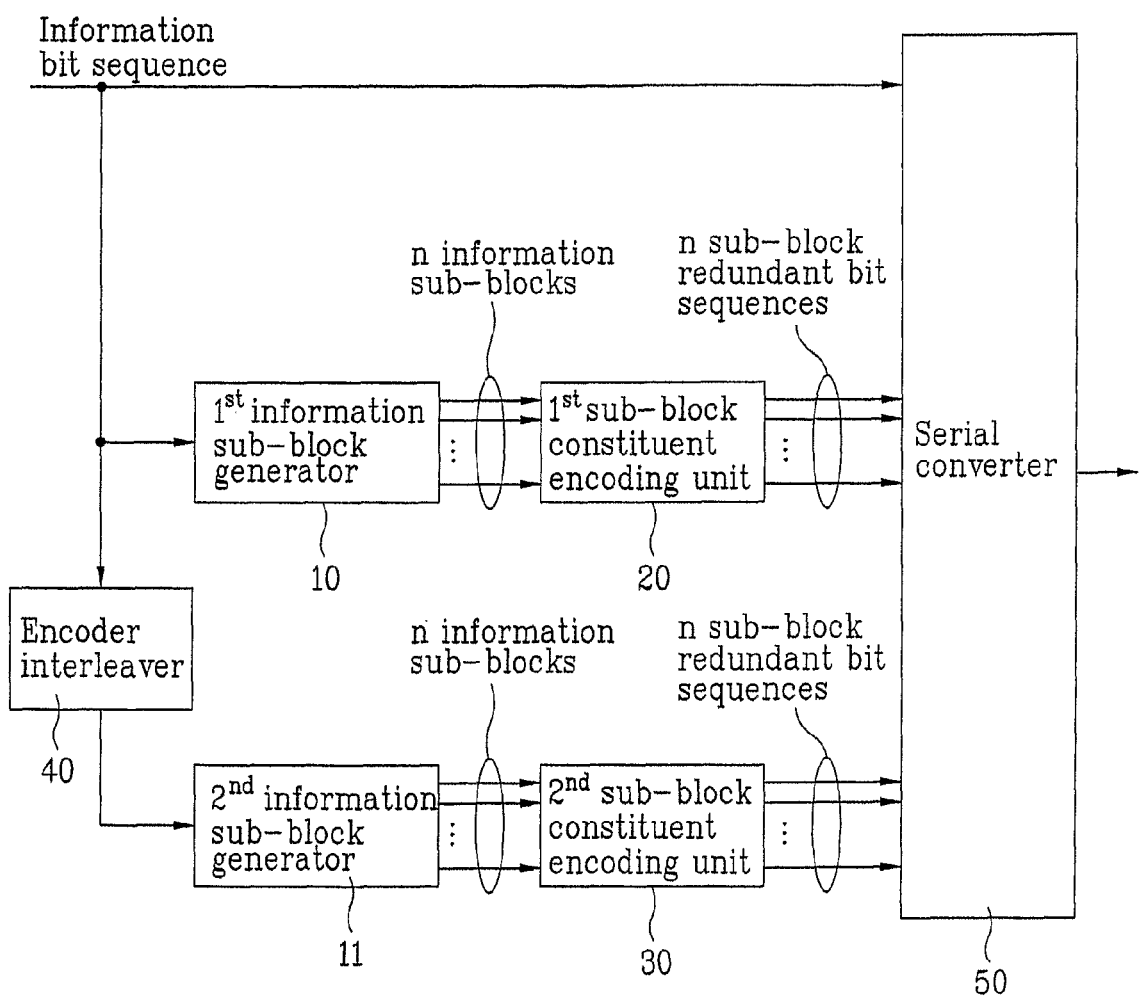
FIG. 5 is a block diagram of an apparatus for encoding turbo codes according to one embodiment of the present invention.

FIG. 5 is a block diagram of an apparatus for encoding turbo codes according to one embodiment of the present invention.

Referring to FIG. 5, an apparatus for encoding turbo codes according to one embodiment of the present invention performs turbo encoding on an inputted information bit sequence by an information frame unit.

The turbo encoding apparatus according to one embodiment of the present invention includes first and second information sub-block generators 10 and 11, each of which receives an information frame of a length N, divides the received information frame into n information sub-blocks and then outputs the information sub-blocks, first and second sub-block constituent encoding units 20 and 30, each of which performing encoding on the corresponding n information sub-blocks, an encoder interleaver 40 interleaving information bits, and a serial converter 50 converting each output of the first and second sub-block constituent encoding units 20 an 30 together with the information bits to a serial signal.

The first information sub-block generator 10 divides the inputted information bit sequence into n information sub-blocks by an information frame unit and then outputs the n information sub-blocks. In particular, the first information sub-block generator 10 groups each of the information frame of the inputted information bit sequence into n information sub-blocks to output. In the embodiment shown in FIG. 5, each information frame includes N consecutive information bits and each information sub-block includes N/n consecutive information bits.

The encoder interleaver 40 receives the same information bits that are inputted to the first information sub-block generator 10. The encoder interleaver 40 performs interleaving on each information frame of the inputted information bit sequence and then outputs the interleaved information frame.

The encoder interleaver 40 may include a block interleaver, a convolutional interleaver, a contention-free interleaver or the like. In particular, when one information frame is interleaved by being divided into a plurality of groups, the contention-free interleaver is a sort of an interleaving technique to prevent bits, which are located at the same positions of a plurality of the groups prior to the interleaving, respectively from gathering into one group after the interleaving. The contention-free interleaver is explained in detail by Oscar Y. Takeshita, "On Maximum Contention-Free Interleavers and Permutation Polynomials Over Integer Rings," IEEE Transactions On Information Theory, VOL 53, No. 3, pp. 1249-1253, March 2006.

The second information sub-block generator 11 groups the information frame interleaved by the encoder interleaver 40 into n information sub-blocks and then outputs the grouped sub-blocks.

The n information sub-blocks generated by the first information sub-block generator 10 are inputted to the first sub-block constituent encoding unit 20, while the n information sub-blocks generated by the second information sub-block generator 11 are inputted to the second sub-block constituent encoding unit 30. The first sub-block constituent encoding unit 20 generates n sub-block redundant-bit sequences, i.e., parity bit sequences by encoding the n information sub-blocks independently. The second sub-block constituent encoding unit 30 also generates n sub-block redundant-bit sequences, i.e., parity bit sequences by encoding the n information sub-blocks independently. In the following description, the sub-block redundant bits generated by the first sub-block constituent encoding unit 20 are named 'first sub-block redundant bits' and the sub-block redundant bits generated by the second sub-block constituent encoding unit 30 are named 'second sub-block redundant bits'.

Figure 6:
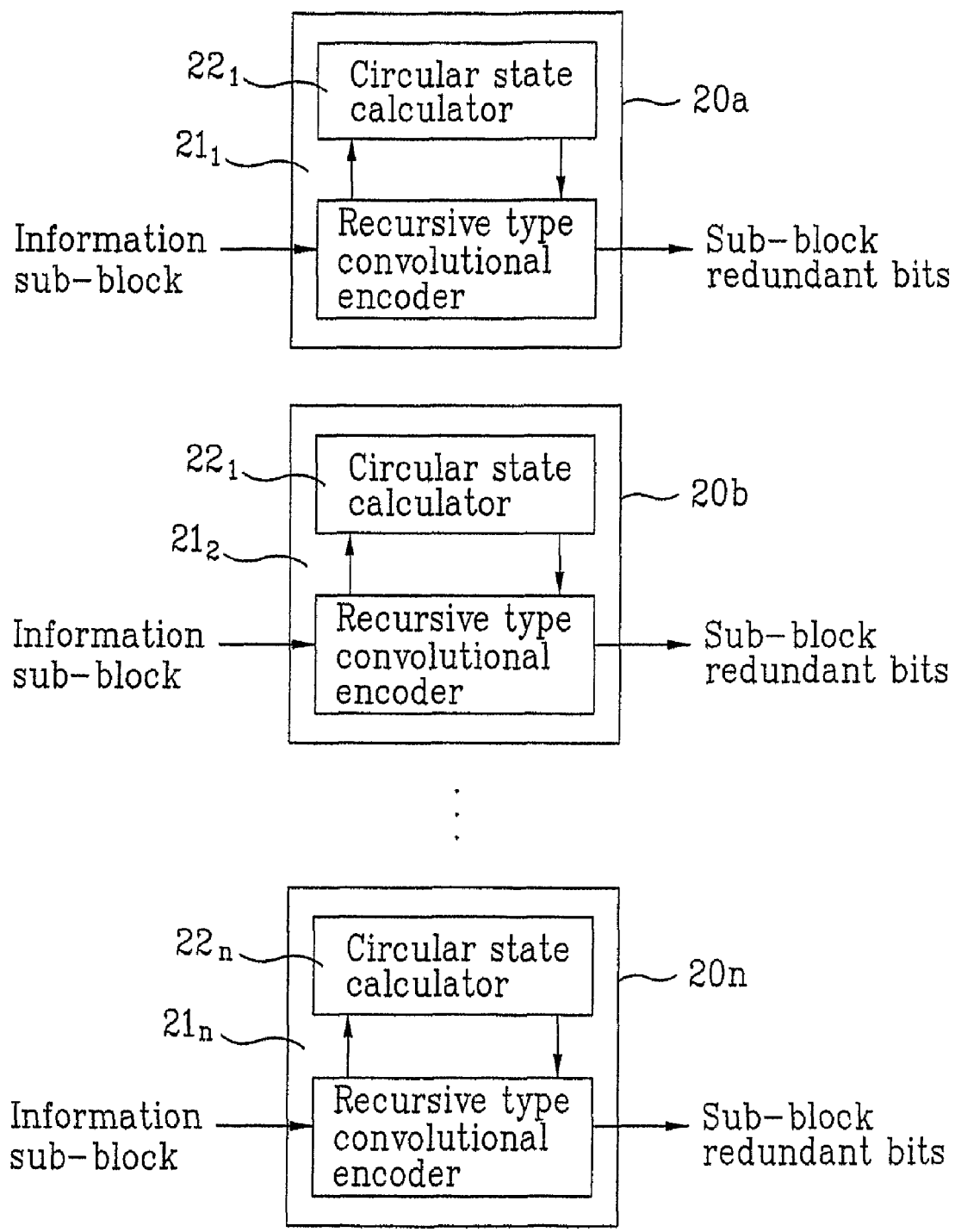
FIG. 6 is a block diagram of a sub-block constituent encoder configuring an apparatus for encoding turbo codes according to one embodiment of the present invention.

FIG. 6 is a detailed block diagram of the first or second sub-block constituent encoding unit 20 or 30 of the apparatus for encoding turbo codes according to one embodiment of the present invention. An encoding process performed by the first or second sub-block constituent encoding unit 20 or 30 is explained in detail with reference to FIG. 6 as follows.

Referring to FIG. 6, the first or second sub-block constituent encoding unit 20 or 30 includes n sub-block constituent encoders 20a to 20n. Each of the sub-block constituent encoders includes a recursive type convolutional encoder and a circular state calculator. In FIG. 6, the sub-block constituent encoder is indicated by a closed loop enclosing one circular state calculator and one recursive type convolutional encoder.

Each of the recursive type convolutional encoders $21_1$ to $21_n$ included in the first or second sub-block constituent encoding unit 20 or 30 performs encoding after having set an initial state to a zero state. Once the encoding for each information sub-block is completed, the recursive type convolutional encoders $21_1$ to $21_n$ supply final states of sub-block redundant bits for each information sub-block to the circular state calculators $22_1$ to $22_n$ calculating corresponding circular states, respectively. The corresponding circular state calculators determine circular states for the sub-block redundant bits, respectively. The determined circular states are set to initial states, and the first sub-block constituent encoding unit 20 and the second sub-block constituent encoding unit 30 performs re-encoding on the same information sub-block based on those initial states. Thus, a circular encoding scheme is applicable to each of the information sub-blocks and the respective sub-block redundant bits are able to have the trellis structure of which initial and final states are equal to each other.

When the circular state calculators $22_1$ to $22_n$ calculate circular states for the sub-block redundant bits, respectively, the circular states can be calculated from the final states for the sub-block redundant bits via formula. Alternatively, the circular states can be found in a manner of composing and storing a lookup table after completion of a calculation process. The circular encoding scheme is described in detail by: [1] C. Weiβ, C. Bettstetter, S. Riedel, "Code Construction and Decoding of Parallel Concatenated Tail-Biting Codes," IEEE Transactions on Information Theory, VOL. 47, No. 1, pp. 366-386, January 2001; and [2] C. Douillard, et al. "The Turbo code Standard for DVB-RCS," $2^{nd}$ International Symposium on Turbo Codes & Related Topics, Brest, France, September 2000, pp. 535-538.

After completion of the encoding by the first sub-block constituent encoding unit 20 and the second sub-block constituent encoding unit 30, the serial converter 50 receives an information bit sequence, the first sub-block redundant bits and the second sub-block redundant bits and then converts the received bits to a serial signal. For example of one information frame, the first sub-block constituent encoding unit 20 outputs n first sub-block redundant-bit sequences and the second sub-block constituent encoding unit 30 outputs n second sub-block redundant-bit sequences. Accordingly, the serial converter 50 converts the received bits to the serial signal in a manner that information bits corresponding to one information frame, the corresponding n first sub-block redundant bit sequences and the corresponding n second sub-block redundant bit sequences are aligned in their orders.

Figure 7:
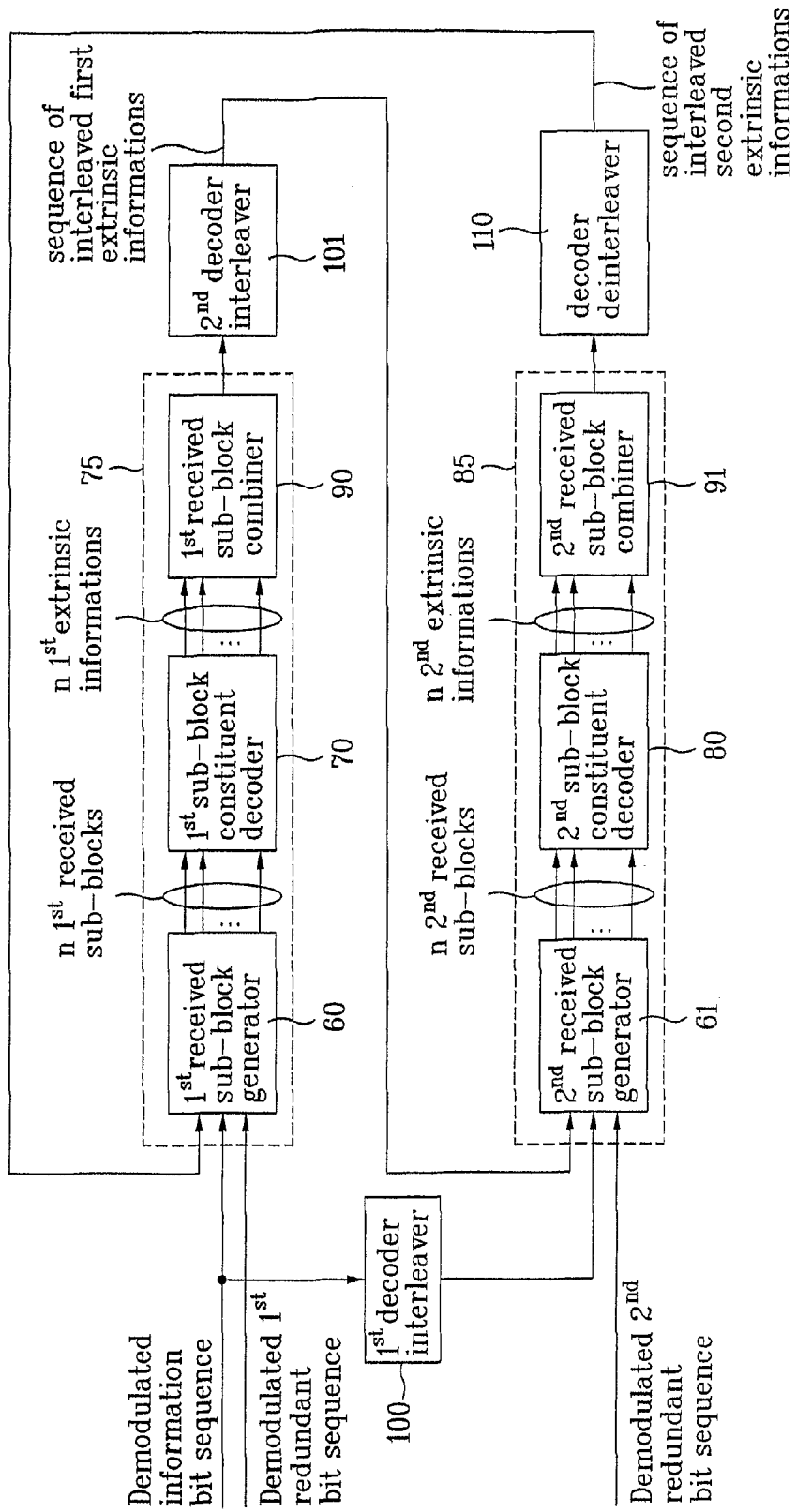
FIG. 7 is a block diagram of an apparatus for decoding turbo codes according to one embodiment of the present invention.

FIG. 7 is a block diagram of an apparatus for decoding turbo codes according to one embodiment of the present invention. The decoding apparatus shown in FIG. 7 corresponds to the turbo encoding apparatus shown in FIG. 5 and is an example of an apparatus for decoding the signal originating from a signal received via a wireless or wire transport channel that induces information loss.

Signals, which were encoded by the scheme explained in FIG. 5, modulated, transmitted via a wire/wireless channel, received by a receiving side and then demodulated, includes an information bit sequence, a first redundant-bit sequence and a second redundant bit sequence. In this case, for one information frame, the first redundant bit sequence corresponds to the n first sub-block redundant-bit sequences generated by the first sub-block constituent encoding unit 20 shown in FIG. 5 and the second redundant bit sequence corresponds to the n second sub-block redundant-bit sequences generated by the second sub-block constituent encoding unit 30 shown in FIG. 5.

Referring to FIG. 7, a decoder according to one embodiment of the present invention includes a first constituent decoding module 75, a second constituent decoding module 85, a first decoder interleaver 100, a second decoder interleaver 101 and a decoder deinterleaver 110. The first constituent decoding module 75 includes a first received sub-block generator 60, a first sub-block constituent decoder 70 and a first received sub-block combiner 90. The second constituent decoding module 8 includes a second received sub-block generator 61, a second sub-block constituent decoder 80 and a second received sub-block combiner 91.

The first received sub-block generator 60 receives the information bit sequence and first redundant bit sequence configuring the demodulated signal and a sequence of the interleaved second extrinsic information. The second received sub-block generator 61 receives the information bit sequence and second redundant bit sequence configuring the demodulated signal and a sequence of the interleaved first extrinsic information. The first received sub-block generator 60 generates n received sub-blocks by dividing the information bit sequence, the first redundant bit sequence and the sequence of the interleaved second extrinsic information into sized corresponding to an information frame.

The first decoder interleaver 100 receives the information bit sequence configuring the demodulated signal and generates a interleaved information frame by performing interleaving on each information frame of the received information bit sequence. The second received sub-block generator 61 generates n received sub-blocks by dividing the information bit sequence, the second redundant bit sequence and the sequence of the interleaved first extrinsic information into sized corresponding to an information frame. In this case, a received sub-block is defined as a set of adjacent information bits, adjacent second or first redundant bits and adjacent and interleaved second or first extrinsic information.

Information bits included in an $i^{th}$ received sub-block are the demodulated signal corresponding to the information bits included in an $i^{th}$ information sub-block. Redundant bits included in the $i^{th}$ received sub-block are the demodulated signal corresponding to $i^{th}$ sub-block redundant bits. Interleaved extrinsic information included in the $i^{th}$ received sub-block is to recover the information bits included in the $i^{th}$ information sub-block. The sequence of the interleaved first extrinsic information can be named a second intrinsic information and the sequence of the interleaved second extrinsic information can be called a first intrinsic information.

The first sub-block constituent decoder 70 performs independent decoding on each of the n received sub-blocks outputted by the first received sub-block generator 60. The second sub-block constituent decoder 80 performs independent decoding on each of the n received sub-blocks generated by the second received sub-block generator 61.

Figure 1:
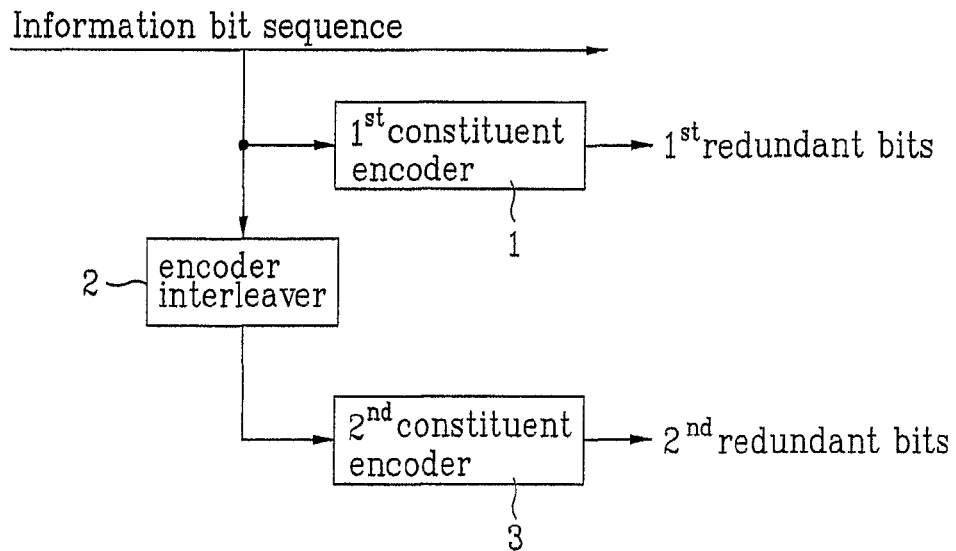
FIG. 1 is a block diagram of a general turbo code encoding apparatus according to a related art.
Figure 2:
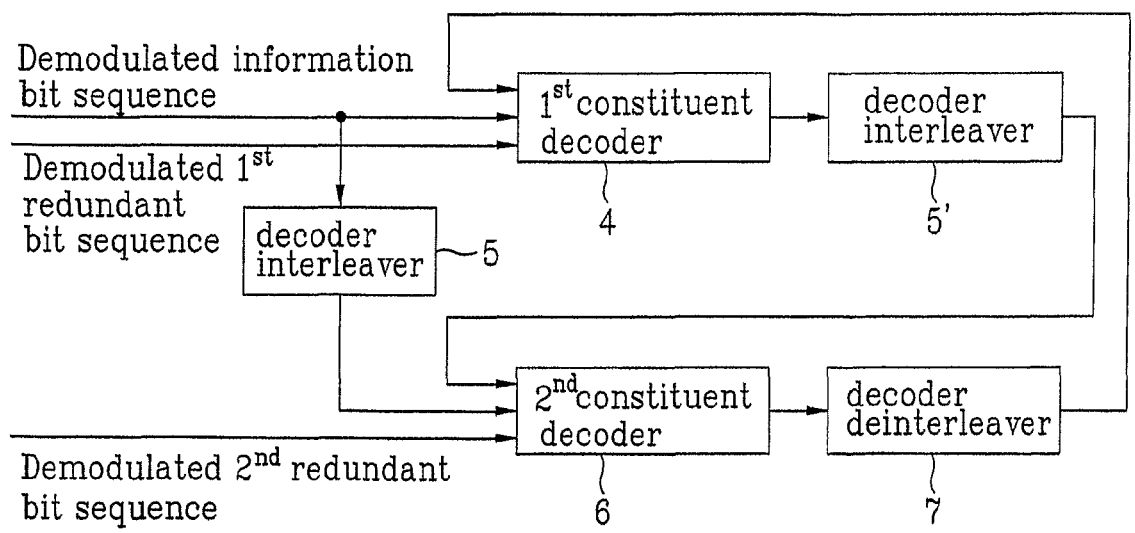
FIG. 2 is a block diagram of a turbo code decoding apparatus according to a related art.
Figure 3A:
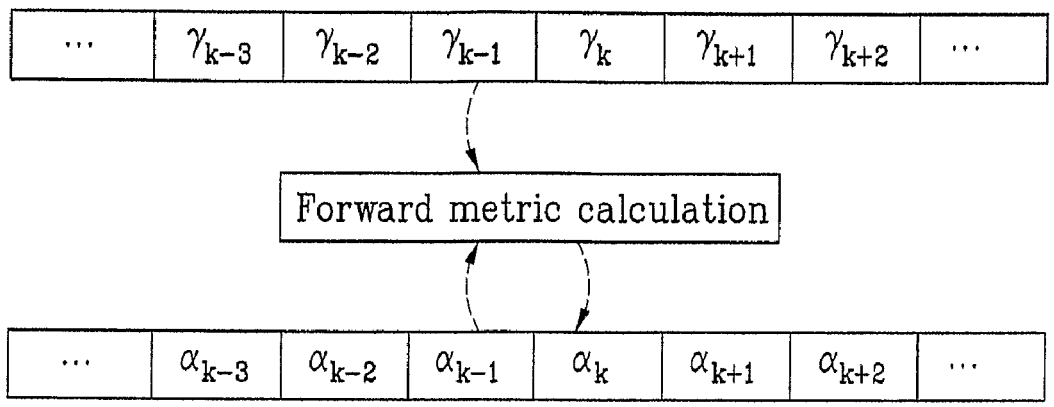
FIG. 3A and FIG. 3B are diagrams for forward and backward metric operational methods in a turbo code decoding apparatus according to a related art, respectively.
Figure 3B:
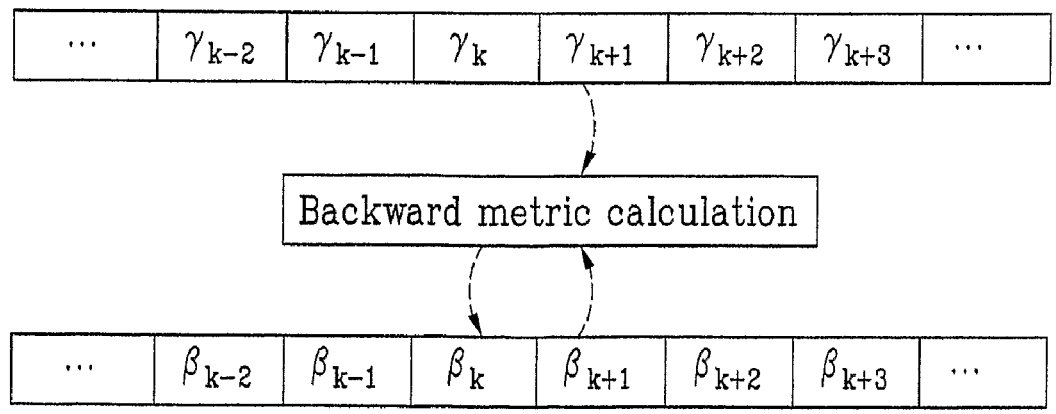
Figure 4A:
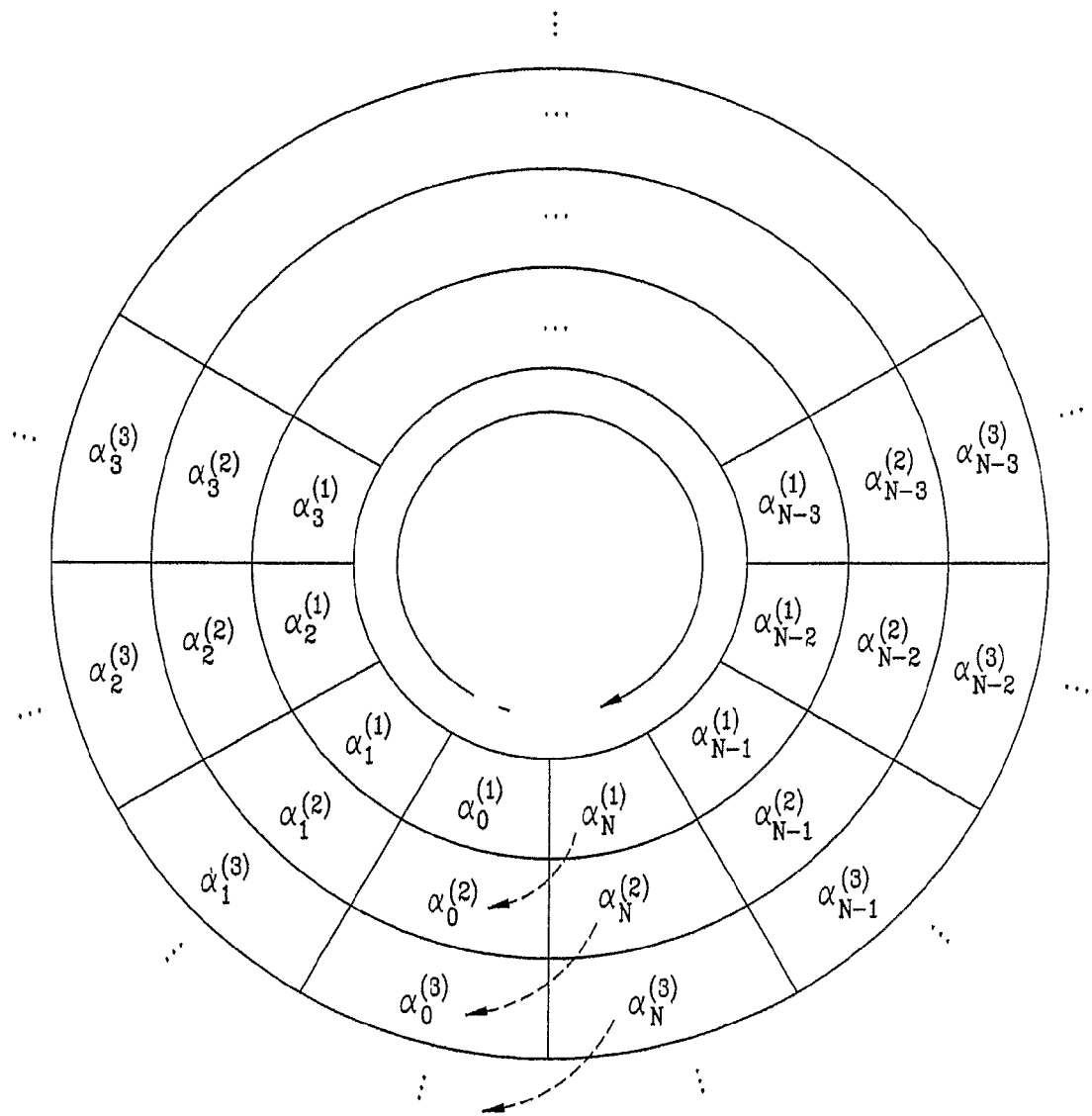
FIG. 4A and FIG. 4B are diagrams for forward and backward metric operational methods in a turbo code decoding apparatus adopting a circular decoding scheme, respectively.
Figure 4B:
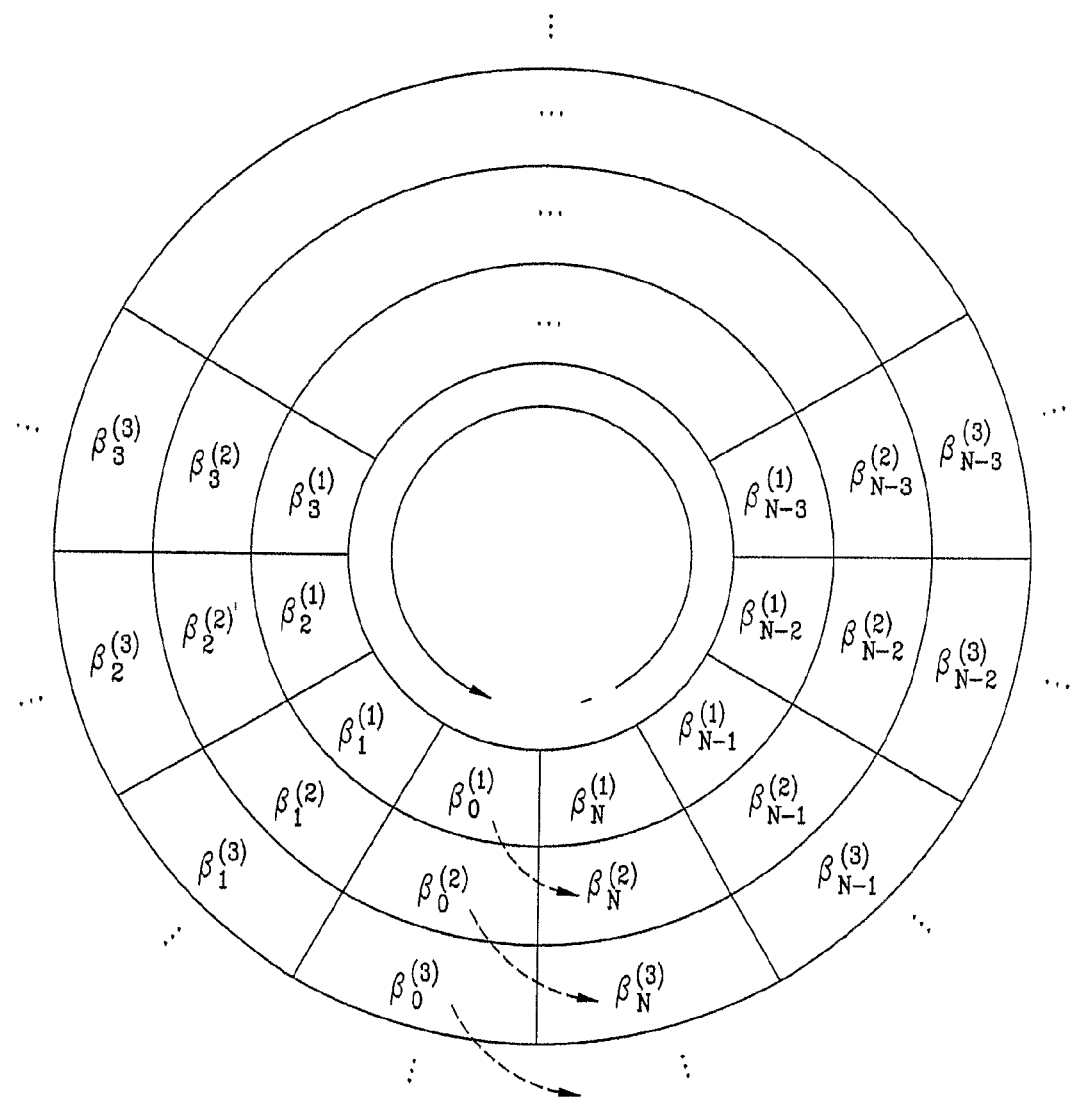
Figure 8:
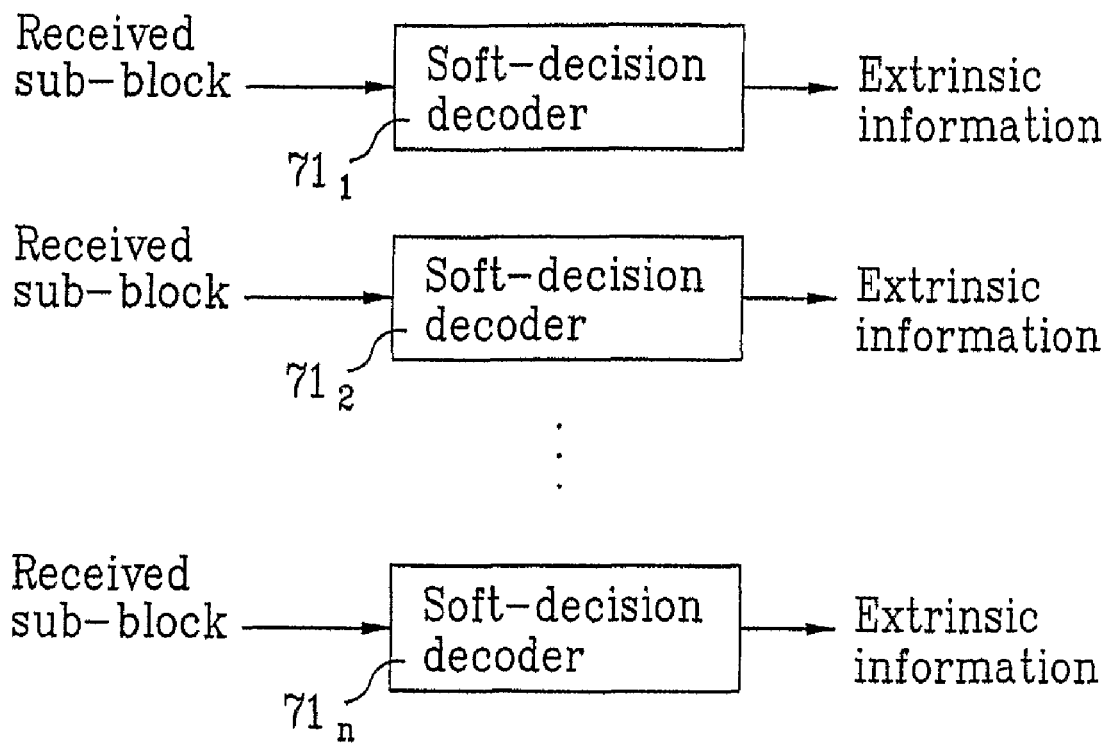
FIG. 8 is a block diagram of a sub-block constituent decoder configuring an apparatus for decoding turbo codes according to one embodiment of the present invention.

FIG. 8 is a detailed block diagram of the first or second sub-block constituent decoder 70 or 80 of the apparatus for decoding turbo codes according to one embodiment of the present invention. Referring to FIG. 8, the sub-block constituent decoder 70 or 80 includes n soft-decision decoders $71_1$ to $72_n$. An operation performed by each of the soft-decision decoders $71_1$ to $72_n$ is identical to that of the first or second constituent decoder 4 or 6 of the general turbo decoder shown in FIG. 2. In particular, each of the soft-decision decoders $71_1$ to $72_n$ calculates a transition metric, a forward metric and a backward metric and then calculates extrinsic information using the calculated metrics. Since the circular encoding scheme has been applied to each of the information sub-blocks, as mentioned in the foregoing description, the forward and backward metric operational methods in the turbo code decoding apparatus adopting the circular encoding scheme are applicable in the same manner.

As each of the first and second sub-block constituent decoder 70 and 80 decodes n received sub-blocks in parallel, it outputs n extrinsic informations in parallel. Each of the first and second received sub-block combiners 90 and 91 serially connects the n extrinsic informations supplied by the corresponding sub-block constituent decoder 70 or 80 and then outputs a result to the corresponding second decoder interleaver 101 or the decoder deinterleaver 110.

The second decoder interleaver 101 performs interleaving on a sequence of the received extrinsic informations by a unit corresponding to an information frame, while the decoder deinterleaver 110 performs interleaving on a sequence of the received extrinsic informations received from the second received sub-block combiner 91 by a unit corresponding to an information frame.

The sequence of the interleaved extrinsic informations outputted from the second decoder interleaver 101 is inputted to the second received sub-block generator 61, while the sequence of the interleaved extrinsic informations outputted from the decoder deinterleaver 110 is inputted to the first received sub-block generator 60. So, the sequences of the interleaved extrinsic informations are used for iterative execution of the above-explained decoding process.

Meanwhile, each of the first and second sub-block constituent decoders 70 and 80 is able to perform n soft-decision decodings in parallel. Accordingly, a decoding speed of the turbo code decoding apparatus according to the present invention increases n-times faster than that of the general turbo coded decoding apparatus. And, since the circular encoding scheme per information sub-block according to one embodiment of the present invention has no additional bit insertion unlike the periodic insertion method of tail bits, it is able to provide band efficiency better than that of the general transmission scheme that uses general turbo codes.

Moreover, the configuration according to one embodiment of the present invention is able to employ the operational blocks, which configure the general turbo encoding and decoding apparatuses, as they are without modification. For instance, the soft-decision decoder 71 within the first or second sub-block constituent decoder 70 or 80 is identical to the first or second constituent decoder of the related art turbo code decoding apparatus. So do the decoder interleavers 100 and 101 and the decoder deinterleaver 110. It can be said that the information sub-block generators 10 and 11, the received sub-block generators 60 and 61 and the received sub-block combiners 90 and 91 are just means for parallelization or serialization. So, the turbo encoding and decoding apparatuses according to the present invention are able to minimize an amount for calculation to increase a decoding speed.

The turbo encoding and decoding apparatuses according to one embodiment of the present invention are able to enhance decoding performance of turbo codes. If multi-circular decoding is applied, a circular state can be provided to each received sub-block. So, highly reliable metrics can be calculated in calculating forward and backward metrics.

Therefore, the present invention provides the following effects or advantages. First of all, by applying a circular encoding scheme to a plurality of information sub-blocks in a process for encoding turbo codes and decoding a plurality of received sub-blocks simultaneously in a process for decoding turbo codes, the present invention is able to enhance speed and performance of a turbo code encoder or decoder. Secondly, in enhancing an encoding or decoding speed, band efficiency is maintained and a corresponding calculation amount is considerably small.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

Accordingly, the present invention is applicable to all technical fields for encoding and decoding.

What is claimed is:

1. A method of decoding a bit sequence encoded by turbo code, the method comprising:
    dividing a first information frame including information bits included in the encoded bit sequence into at least two first sub-blocks;
    encoding, independently, each of the at least two received sub-blocks to generate at least two first redundant bit sub-blocks;
    interleaving the information bits included in the encoded bit sequence;
    dividing a second information frame including the interleaved information bits into at least two second sub-blocks;
    encoding, independently, each of the at least two second sub-blocks to generate at least two second redundant bit sub-blocks;
    dividing a third information frame including a first interleaved extrinsic information sequence, the information bits, and first redundant bits into, at least two first received sub-blocks;
    decoding, independently, each of the at least two first received sub-blocks;
    interleaving the information bits, after demodulation;
    dividing a fourth information frame including a second interleaved extrinsic information sequence, the interleaved information bits, and second redundant bits into, at least two second received sub-blocks; and
    decoding, independently, each of the at least two second received sub-blocks.

2. The method of claim 1, wherein the information bits included in the first information frame are generated by turbo-coding one information frame.

3. The method of claim 1, wherein each of the at least two first received sub-blocks and the at least two second received sub-blocks are decoded by a circular decoding scheme.

4. The method of claim 1, wherein each of the at least two first received sub-blocks and the at least two second received sub-blocks are decoded in parallel.

5. An apparatus for performing turbo encoding on information bits input by a unit of an information frame including a predetermined number of bits, the apparatus comprising:
    a first constituent encoding module comprising:
        a first information sub-block generator for dividing the information frame into at least two first information sub-blocks; and
        a first sub-block constituent encoding unit comprising at least two sub-block constituent encoders for encoding the at least two first information sub-blocks, respectively;
    an interleaver for interleaving information bits of the information frame and outputting an interleaved information frame, a second information sub-block generator for dividing the interleaved information frame into the at least two second information sub-blocks; and
    a second constituent encoding module for independently encoding each of at least two second information sub-blocks.

6. The apparatus of claim 5, wherein the second constituent encoding module comprises:
    a second sub-block constituent encoding unit comprising at least two sub-block constituent encoders for encoding the at least two second information sub-blocks.

7. The apparatus of claim 5, wherein each of the at least two sub-block constituent encoders of the first sub-block constituent encoding unit comprises:
- a recursive type convolutional encoder for outputting sub-block redundant bits from the at least two first information sub-blocks; and
- a circular state calculator for deciding circular states of the sub-block redundant bits; and
- wherein each of the at least two sub-block constituent encoders of the second sub-block constituent encoding unit comprises:
- a recursive type convolutional encoder for outputting sub-block redundant bits from the at least two second information sub-blocks; and
- a circular state calculator for deciding circular states of the sub-block redundant bits.

8. The apparatus of claim 5, wherein each of the at least two sub-block constituent encoders of the first sub-block constituent encoding unit encodes each of the at least two first information sub-blocks via a circular encoding scheme and each of the at least two sub-block constituent encoders of the second sub-block constituent encoding unit encodes each of the at least two second information sub-blocks via a circular encoding scheme.

9. The apparatus of claim 5, wherein the at least two first information sub-blocks comprise the information bits neighboring to one another within the information frame and the at least two second information sub-blocks of the interleaved information frame comprise the information bits neighboring to one another within interleaved information frame.

10. The apparatus of claim 5, wherein the first sub-block constituent encoding unit encodes each of the at least two first information sub-blocks in parallel and second sub-block constituent encoding unit encodes each of the at least two second information sub-blocks in parallel.

11. An apparatus for decoding a bit sequence encoded by a turbo code, the apparatus comprising:
- a first constituent decoding module outputting a first extrinsic information sequence in a manner of dividing a first information frame including information bits included in the encoded bit sequence and first redundant bits into at least two received sub-blocks and decoding each of the at least two received sub-blocks independently;
- a first decoder interleaver rearranging the information bits by performing interleaving on the information bits;
- a second decoder interleaver interleaving to rearrange the first extrinsic information sequence output by the first constituent decoding module;
- a second constituent decoding module outputting a second extrinsic information sequence in a manner of dividing a second information frame including the rearranged information bits and second redundant bits into at least two received sub-blocks and decoding each of the at least two received sub-blocks independently; and
- a decoder deinterleaver rearranging the second extrinsic information sequence to output the second extrinsic information sequence.

12. The apparatus of claim 5, wherein each of the at least two sub-blocks for the first or second information frame is decoded in parallel.

13. The apparatus of claim 12, wherein each of the at least two received sub-blocks is decoded by a circular decoding scheme.

* * * * *